(12) United States Patent
Chan et al.

(10) Patent No.: US 6,563,708 B1
(45) Date of Patent: May 13, 2003

(54) HEAT DISSIPATING ASSEMBLY FOR A SERVER BOX BODY

(75) Inventors: Chen-Hao Chan, Taoyuan (TW); Hsiang-Chan Chen, Taipei (TW)

(73) Assignee: NEXCOM International Co., Ltd., Taipei Hsien (TW)

( * ) Notice: Subject to any disclaimer, the term of this patent is extended or adjusted under 35 U.S.C. 154(b) by 0 days.

(21) Appl. No.: 10/270,327

(22) Filed: Oct. 15, 2002

(51) Int. Cl.[7] .................................................. H05K 7/20
(52) U.S. Cl. ........................................ 361/695; 454/184
(58) Field of Search ........................ 165/803, 121–122; 361/689, 694–697, 715, 724–727; 454/184

(56) References Cited

U.S. PATENT DOCUMENTS 5,027,254 A * 6/1991 Corfits et al. ................ 361/695
5,193,050 A * 3/1993 Dimmick et al. ............ 361/695
6,392,872 B1 * 5/2002 Doustoyu, III et al. ..... 361/695
6,466,441 B1 * 10/2002 Suzuki et al. ................ 361/395
6,483,699 B1 * 11/2002 Salmonson et al. ......... 361/695

* cited by examiner

*Primary Examiner*—Gregory Thompson
(74) *Attorney, Agent, or Firm*—Birch, Stewart, Kolasch & Birch, LLP

(57) ABSTRACT

An improved heat dissipating assembly for a server box body includes a box body and a sealing cover. A grid plate is transversely erected at the center of the box body. An upper end of one side of the grid plate is provided with a plurality of air-absorbing portions having fans therein. The other side of the grid plate has a plurality of main boards and heat dissipating plates insertably disposed thereon. The invention is characterized in that a suitable clearance is formed between a rear side of the grid plate of the box body and the partition plate, and a heat concentration area is also formed therebetween. The hot air from the main boards and the heat dissipating plates is discharged to the concentration area for drawing by the fans in the air-absorbing portions to the outside.

2 Claims, 5 Drawing Sheets

HEAT DISSIPATING ASSEMBLY FOR A SERVER BOX BODY

BACKGROUND OF THE INVENTION (a) Field of the Invention

The invention provides an improved heat dissipating assembly for a server box body, more particularly to a heat concentration area between a main board and a front side of a heat dissipating plate within a housing so that hot air is converged therein and then extracted by use of a plurality of powerful turbo type fans within air-absorbing portions. The invention provides uniform dissipation of heat and is safer in use as compared to individual air extraction in the prior art.

(b) Description of the Prior Art

A conventional server for industrial use is shown in FIGS. 4 and 5, and has a box body 60 and an upper cover 67 forming a housing of the server, within which are provided about 20 main boards 80 and heat dissipating plates 90. The cross section of the box body 60 is a U-shaped structure. A grid plate 63 is erected at a suitable central position. An upper end of one side of the grid plate 63 is provided with a plurality air-absorbing portions 64 having fans 70 therein. The lower end is provided with a socket disk 65. The rear end of the socket disk 65 is connected to other components. A specific space of the base plate on the other side of the grid plate 63 is provided with a partition plate 61, which forms an air channel 66 with the base plate, and the outer side end portion is provided with an air vent 62.

The upper front end of the main board 80 is provided with a central processing unit 81, which is the major source of heat. Therefore, the other side thereof is provided with a heat dissipating plate 90 having a fan 91. The fan 91 on the heat dissipating plate 90 draws the air current from the air vent 62 through the air passage 66 upwardly over the heat absorbed by the heat dissipating plate 90 through the grid plate 63, and the fan 70 of the air-absorbing portion 64 brings the hot air away from the box body 60. The above is the heat dissipating assembly of the conventional server.

As the conventional structure is not ideal in design, there are the following advantages in use:
1. Since the fan casing of the air-absorbing portion at the front end of the box body is directly coupled to the main board at the rear side, and draws hot air generated thereby, and since the heat generating condition of each main board is different, and the extraction capability of each fan also differs, as well as there are air turbulence within the interior at different positions, the amount of air exhausted by each fan is different. Therefore, there is the problem of uneven heat dissipation.
2. Given the above, since heat dissipation is uneven, the main board which is disposed at a position not good for heat dissipation is often damaged, which leads to increase of replacement parts and costs.
3. Given the above, if the fan of one of the air-absorbing portions malfunctions and is not discovered, the corresponding main board is likely to be damaged, which may affect the other components.
4. Therefore, if the fan in any one of the air-absorbing portions is broken, it has to be replaced immediately, which is troublesome in terms of maintenance. Besides, labor costs increase.

SUMMARY OF THE INVENTION

Therefore, the primary object of the invention is to design a structure that can dissipate heat uniformly and satisfactorily. Since the heat dissipation is uniform, even if any one of the fans is broken, the other fans can dissipate the heat therefor temporarily so as to protect the main board and other components.

To achieve the above object, the invention includes a box body with a U-shaped cross section and a sealing cover. The box body has a grid plate transversely erected at the center. An upper end of one side of the grid plate is provided with a plurality of air-absorbing portions having fans therein. A base plate on the other side of the grid plate is provided with a partition plate such that an air channel is formed between the partition plate and the base plate. A component unit formed by a main board and a heat dissipating plate are insertably disposed on the partition plate. A suitable clearance is formed between a rear side of the grid plate of the box body and the partition plate. A socket disk of a height lower than the grid plate is disposed in the clearance. A sealing plate is disposed on a top portion of the socket disk such that a specific clearance is formed between the sealing plate and a top portion of the box body. A heat concentration area is formed among the sealing cover, the grid plate and the sealing plate for exhausting hot air of the main board and the heat dissipating plate to be discharged by the fans of the air-absorbing portions at the same time. Hence, dissipation and extraction of heat is more uniform and safe.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
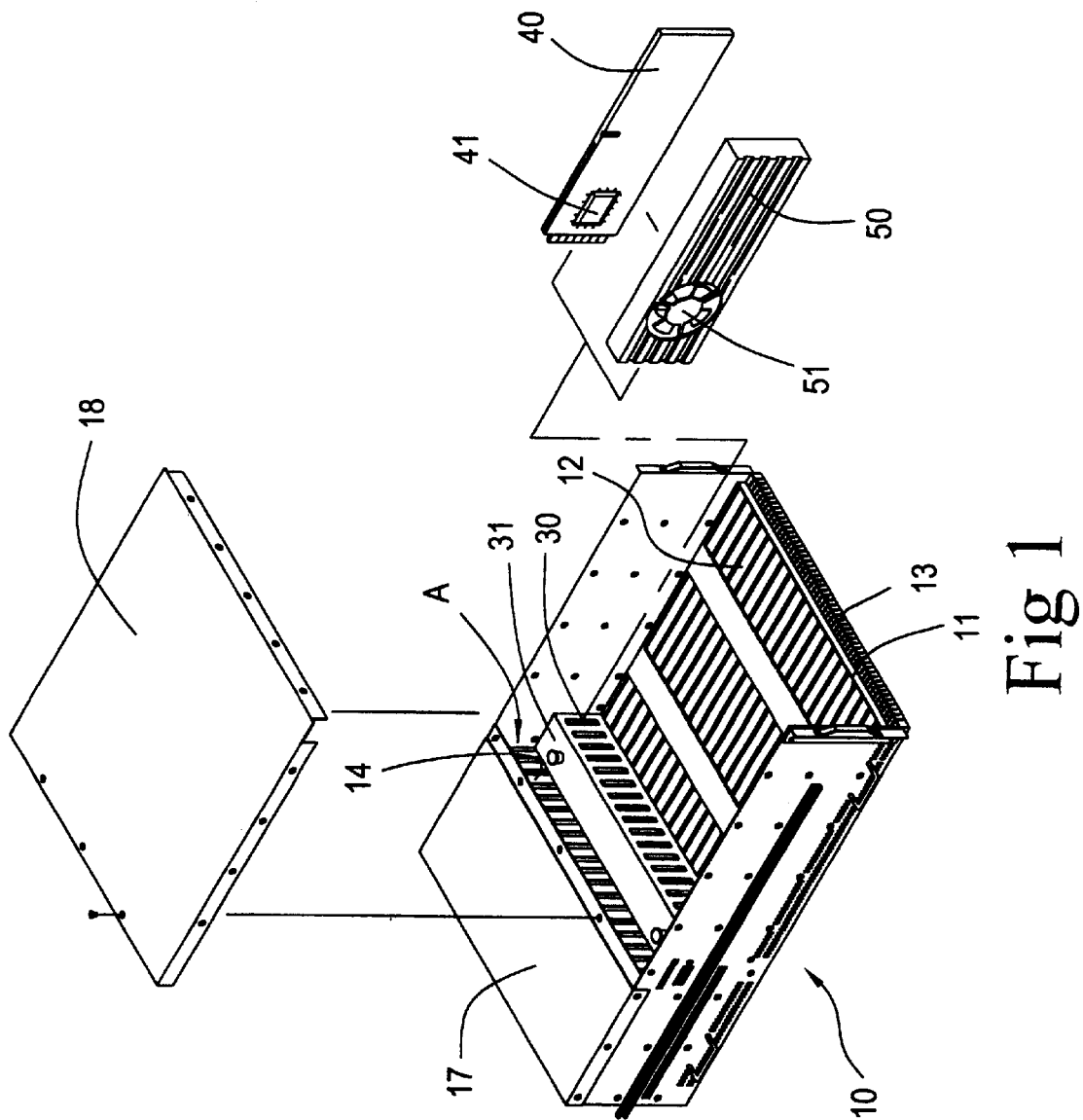
FIG. 1 is a schematic exploded view of the structure of the invention.
Figure 2:
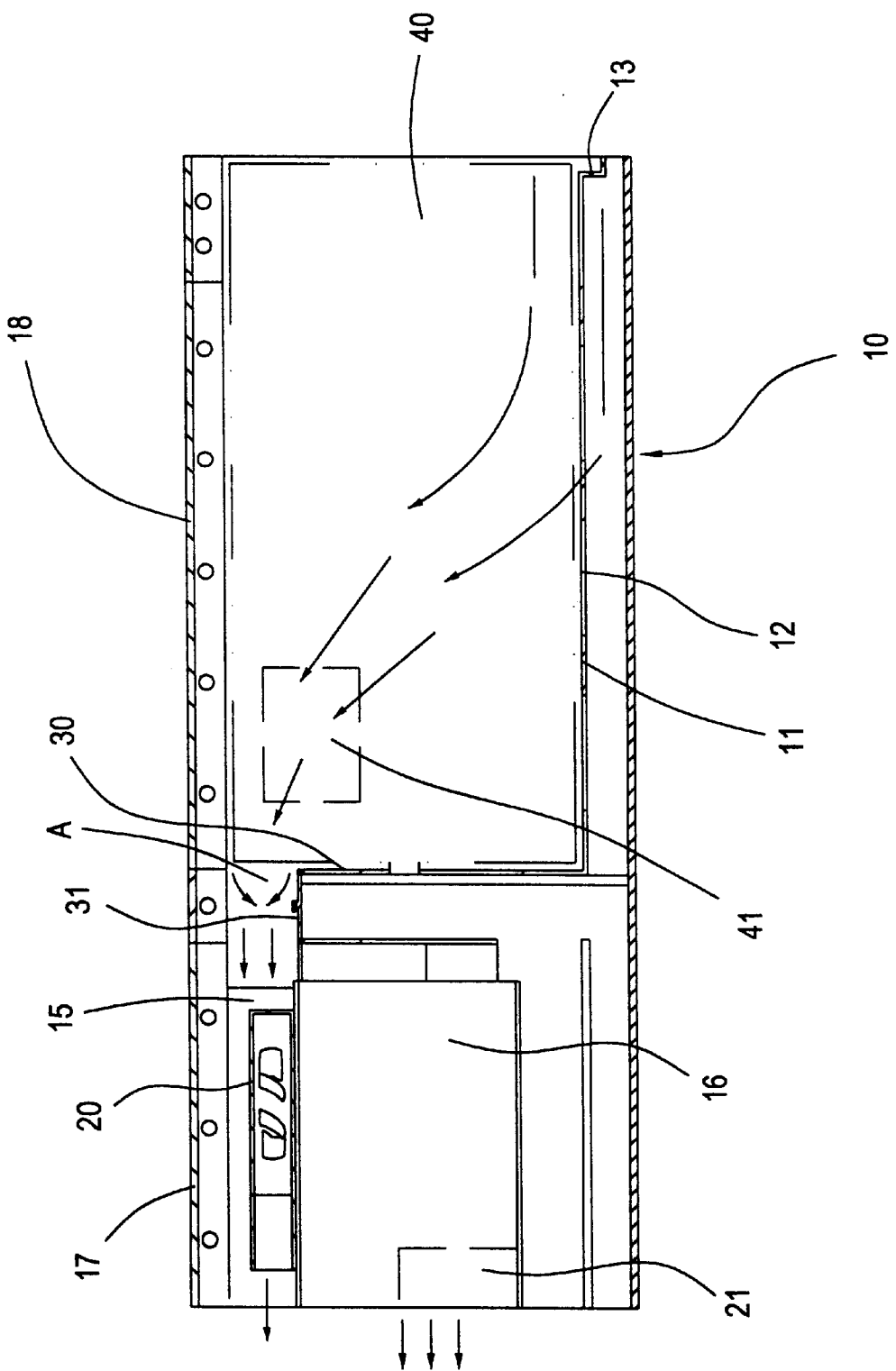
FIG. 2 is a sectional view of the structure of the invention.

With reference to FIGS. 1 and 2, the invention is provided with a box body 10 having a cross section of a U-shaped structure, a grid plate 14 being transversely erected at the center in a slightly forward position. An upper end of one side of the grid plate 14 is provided with a plurality of air-absorbing portions 15 having large turbo type fans 20 therein, the lower end thereof being provided with an electronic component portion 16 having an exhaust fan 21. A partition plate 11 is provided at a specific space on the base plate on the other side of the grid plate 14 such that the partition plate 11 forms an air channel 12, and the outer end portion is provided with an air vent 13.

Twenty sets of unit components formed by main boards 40 and heat dissipating plates 50 are respectively arranged on the partition plate 11, and are coupled to a socket disk 30 at the lower end of the grid plate 14 via sockets. The invention is characterized in that: the rear side of the grid plate 14 of the box body 10 maintains a suitable clearance with the partition plate 11, and the socket disk 30 is configured to have a suitable (lower) height, the top portion of the socket disk 30 being provided with a sealing plate 31 so that there is a specific clearance between the sealing plate 31 and the box body 10.

A front cover plate 17 and a rear cover plate 18 form a sealing cover, which respectively cover the top edge of the box body 10 in front and behind the grid plate 14, forming a heat concentration area (A) among the rear cover plate 18, the grid plate 14 and the sealing plate 31.

Figure 3:
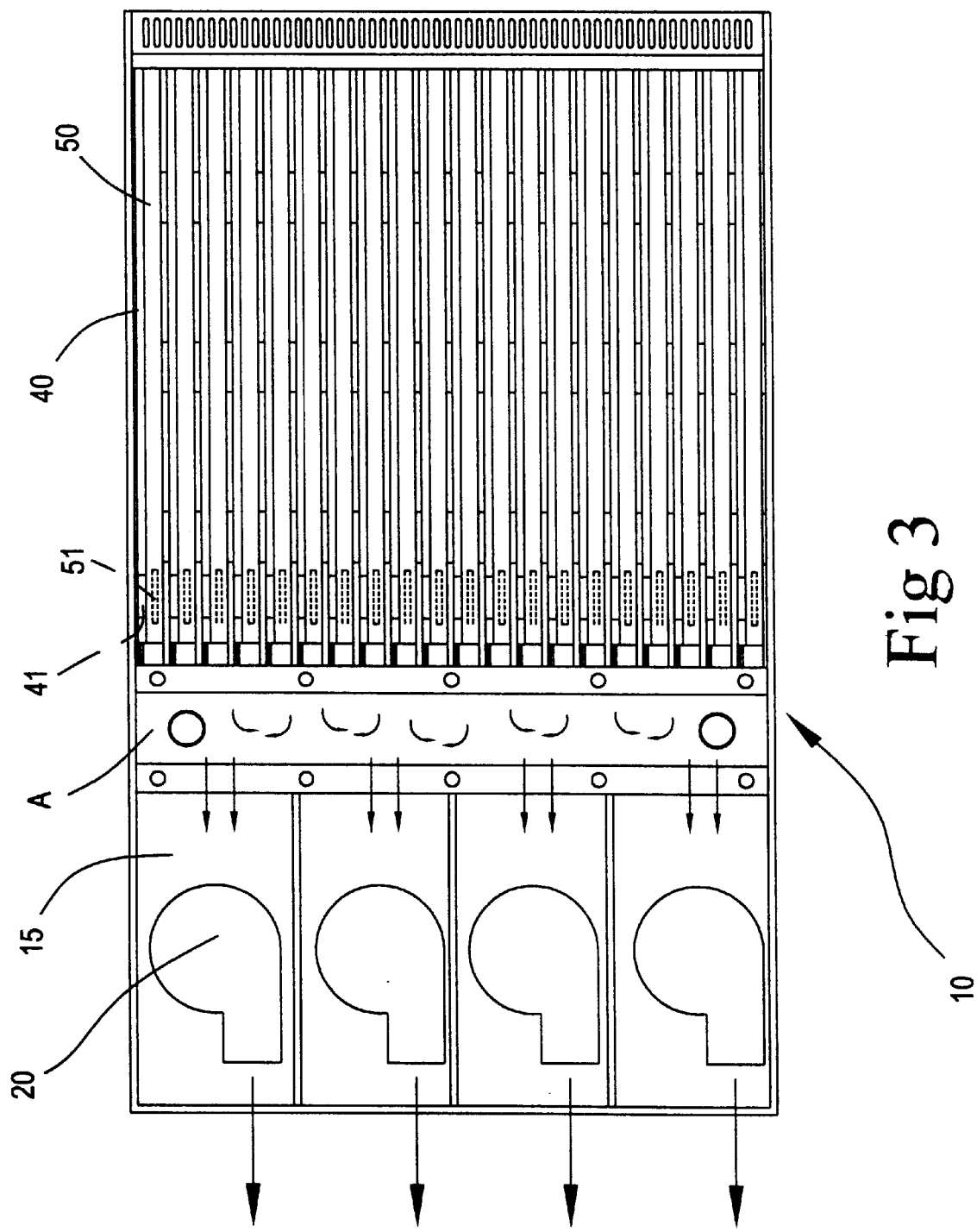
FIG. 3 is a top view of the structure of the invention.
Figure 4:
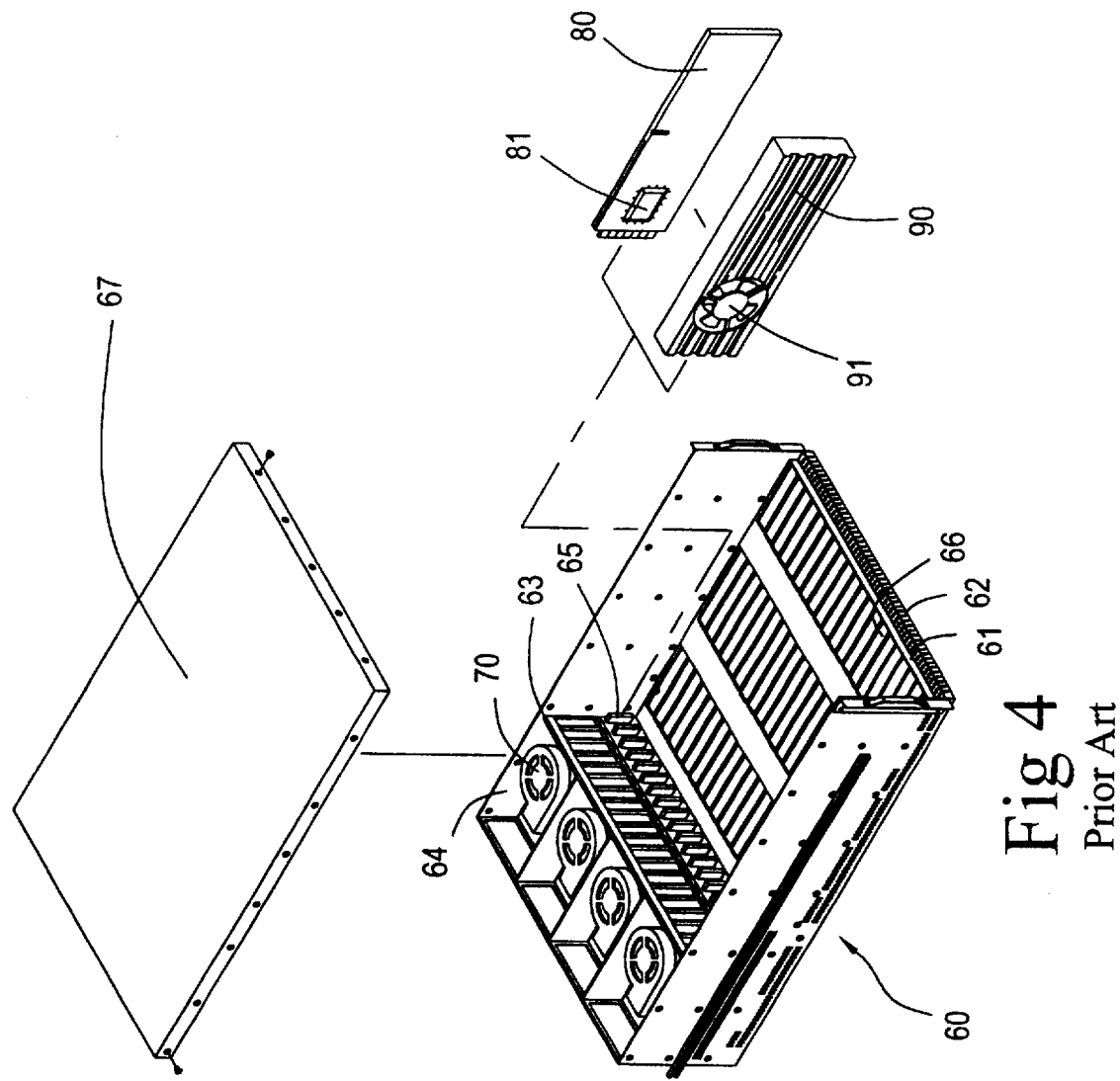
FIG. 4 is a schematic exploded view of the structure of the invention.
Figure 5:
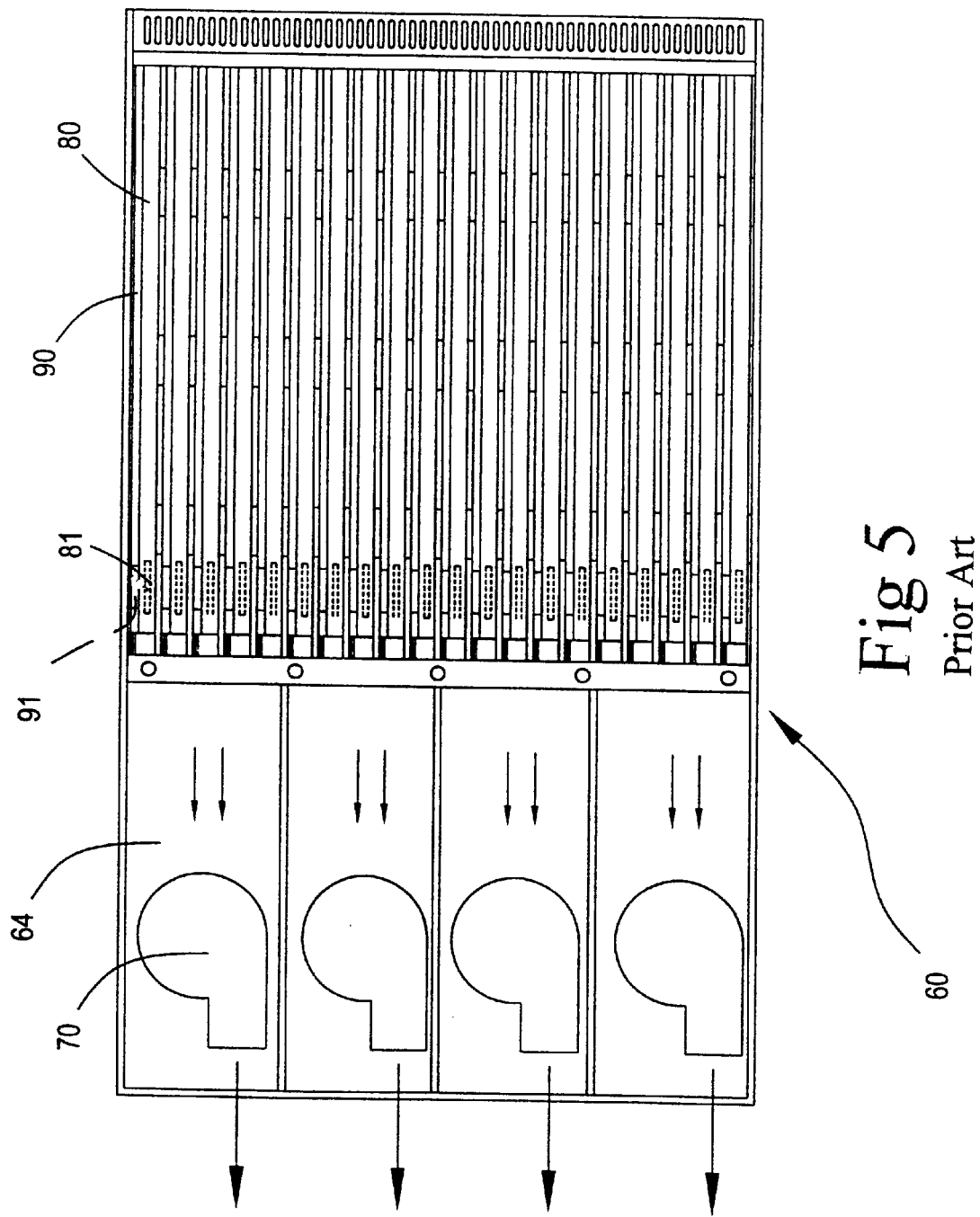
FIG. 5 is a sectional view of the structure of the invention.

Referring to FIGS. 1, 2 and 3, a central processing unit 41 on the main board 40 is the main source of heat, and the corresponding heat dissipating plate 50 is provided with a turbo type fan 51. When the plurality of fans 51 are actuated at the same time, an air current is formed to suck cool air outside the housing via the air vent 13 into the air channel 12. The cool air is further sucked upwardly toward the heat dissipating plate 50 of the central processing unit to absorb heat, and the hot air absorbing the heat is pushed to the heat concentration area (A).

The invention is characterized in that when the large turbo type fans 20 within the plurality of air-absorbing portions 15 are actuated to draw air from the heat concentration area (A), the hot air can be exhausted from the heat concentration area (A) in an uniform manner.

In view of the above, the invention has the following advantages when in use.

1. The invention is designed to push the hot air to the heat concentration area and use several large turbo type fans to draw out the hot air in the heat concentration area at the same time so that the drawing force in the clearance between each main board and the heat dissipating plate is uniform to draw the hot air out; therefore, the heat dissipation of each main board is sufficient and uniform.
2. In view of the above, since all the fans are designed to be actuated to draw the hot air from the heat concentration area, even if any one of the fans breaks down, the heat of the main board with the broken fan can still be dissipated with the help of the other fans; therefore, there is no danger of burning of the main board for the time being.
3. In view of the above, since there are uniform air currents to dissipate heat, the rate of damage is low and the maintenance cost is low. Besides, due to the arrangement of the heat concentration area, the space for heat exhaustion is increased. Due to the presence of the space, maintenance of the main board and the socket disk is more convenient.

Although the present invention has been illustrated and described with reference to the preferred embodiment thereof, it should be understood that it is in no way limited to the details of such embodiment but is capable of numerous modifications within the scope of the appended claims.

What is claimed is:

1. An improved heat dissipating assembly for a server box body, comprising a box body with a U-shaped cross section and a sealing cover, wherein said box body has a grid plate transversely erected at the center, said grid plate having one side provided with a plurality of air-absorbing portions having fans therein, a base plate on the other side of said grid plate being provided with a partition plate such that an air channel is formed between said partition plate and said base plate, a component unit formed by a main board and a heat dissipating plate being insertably disposed on said partition plate, characterized in that:

a suitable clearance is formed between a rear side of said grid plate of said box body and said partition plate, a socket disk of a height lower than said grid plate being disposed in said clearance, a sealing plate being disposed on a top portion of said socket disk such that a specific clearance is formed between said sealing plate and a top portion of said box body, a heat concentration area being formed among said sealing cover, said grid plate and said sealing plate for exhausting hot air of said main board and said heat dissipating plate to be discharged by said fans of said air-absorbing portions at the same time.

2. The improved heat dissipating assembly for a server box body as claimed in claim 1, wherein said sealing cover is formed by a front cover plate and a rear cover plate which are respectively disposed on front and rear sides of said grid plate of said box body.

* * * * *